(12) United States Patent
Maehashi

(10) Patent No.: US 7,182,021 B2
(45) Date of Patent: Feb. 27, 2007

(54) PRINTING PLATE MATERIAL, PRINTING PLATE MATERIAL ROLL, PRINTING PLATE MANUFACTURING PROCESS, AND PRINTING PROCESS

(75) Inventor: Tatsuichi Maehashi, Tokyo (JP)

(73) Assignee: Konica Minolta Medical & Graphic Inc., Tokyo (JP)

( * ) Notice: Subject to any disclaimer, the term of this patent is extended or adjusted under 35 U.S.C. 154(b) by 0 days.

(21) Appl. No.: 10/939,831

(22) Filed: Sep. 13, 2004

(65) Prior Publication Data
US 2005/0061183 A1    Mar. 24, 2005

(30) Foreign Application Priority Data
Sep. 18, 2003  (JP) .............................. 2003-325922
Feb. 24, 2004  (JP) .............................. 2004-047456

(51) Int. Cl.
*B41N 1/00* (2006.01)

(52) U.S. Cl. .................. 101/453; 101/401.1; 101/460; 101/465; 430/302

(58) Field of Classification Search ............ 101/401.1, 101/453–462, 463.1, 464–473; 430/302
See application file for complete search history.

(56) References Cited

U.S. PATENT DOCUMENTS

| | | | | |
|---|---|---|---|---|
| 4,665,824 A * | 5/1987 | Greiner et al. | ............... | 101/492 |
| 5,058,500 A * | 10/1991 | Mizuno | ...................... | 101/142 |
| 5,323,704 A * | 6/1994 | Fraczek | ...................... | 101/375 |
| 6,123,024 A * | 9/2000 | Williams et al. | ............ | 101/129 |
| 2001/0050998 A1* | 12/2001 | Firan et al. | .................. | 382/112 |
| 2003/0143488 A1* | 7/2003 | Teng | .......................... | 430/303 |
| 2003/0217662 A1* | 11/2003 | Koifman et al. | ............ | 101/484 |
| 2003/0219659 A1* | 11/2003 | Manness | ....................... | 430/30 |
| 2003/0221573 A1* | 12/2003 | Leonhardt et al. | ........ | 101/463.1 |
| 2004/0188531 A1* | 9/2004 | Gengel et al. | ............... | 235/491 |
| 2004/0189758 A1* | 9/2004 | Alexia et al. | .................. | 347/87 |

* cited by examiner

*Primary Examiner*—Daniel J. Colilla
*Assistant Examiner*—Jill E. Culler
(74) *Attorney, Agent, or Firm*—Lucas & Mercanti, LLP (57) ABSTRACT

A printing plate material product, is provided with a printing plate material including a substrate and a image forming layer provided on the substrate; and a wireless memory tag mounted on a part of the printing plate material and including a semiconductor memory and an antenna coil through which data is written in or read from the semiconductor memory. The semiconductor memory stores product data written in at the time of the manufacturing process of the printing plate material product.

5 Claims, 2 Drawing Sheets

PRINTING PLATE MATERIAL, PRINTING PLATE MATERIAL ROLL, PRINTING PLATE MANUFACTURING PROCESS, AND PRINTING PROCESS

BACKGROUND OF THE INVENTION

The present invention relates to a technique regarding a printing plate material having a plastic sheet support for computer to plate (hereinafter also referred to as CTP) system, and particular to a printing plate material, a printing plate material roll, a printing plate manufacturing process and a printing process which are controlled during printing by a wireless tag.

The CTP system, in which image data can be directly recorded in a printing plate material, has been widely used accompanied with the digitization of printing data. As a printing plate material usable for CTP, there are a printing plate material comprising an aluminum support such as a conventional PS plate, and a flexible printing plate material comprising a flexible resin film sheet and provided thereon, various functional layers. Recently, in the commercial printing industries, there is a tendency that many kinds of prints are printed in a small amount, and an inexpensive printing plate material with high quality has been required in the market.

As a conventional flexible printing plate material, there are a silver salt diffusion transfer type printing plate material as disclosed in Japanese Patent O.P.I. Publication No. 5-66564, in which a silver salt diffusion transfer type light sensitive layer is provided on a flexible sheet; an ablation type printing plate material as disclosed in Japanese Patent O.P.I. Publication Nos. 8-507727, 6-186750, 6-199064, 7-314934, 10-58636 and 10-244773 in which a hydrophilic layer and a lipophilic layer, one of which is the outermost layer, are provided on a flexible sheet where the outermost layer is ablated by laser exposure to prepare a printing plate; and a heat melt type printing plate material in which a hydrophilic layer and a heat melt image formation layer are provided on a flexible sheet where a hydrophilic layer or a heat melt image formation layer is imagewise heated by laser exposure to heat-fix the image formation layer onto the hydrophilic layer (see for example, Patent document 1 below).

The silver salt diffusion transfer type printing plate material requires a wet development step and a-drying step after exposure, which does not give sufficient dimensional accuracy during the image formation step, and is not suitable to obtain printed matter with high image-quality.

The ablation type printing plate material does not require a wet development step, but image formation due to ablation is likely to fluctuate in dot shape. Further, there is problem in which the interior of the exposing apparatus or the printing plate surface is contaminated by scattered matters caused by ablation of the layer.

A process, comprising a step of forming on a hydrophilic layer a heat-melted image, heated by conversion from laser light, is suitable to obtain high precision images. Among types of this process, there is a so-called on-press development process in which when a printing plate material after image writing is mounted on an off-set press, and a dampening solution is supplied to the printing plate material during printing, only the image formation layer at non-image portions is swollen or dissolved by the dampening solution, and transferred to a printing paper (paper waste), whereby the image formation layer at non-image portions is removed. This process does not require a special development after exposure, resulting in excellent stability of printing quality and excellently meeting environmental concern.

In general, in the CTP system a dot image with a screen line number of 100 to 300 is recorded employing laser beams with a beam spot diameter condensed to from 5 to 30 μm, and each dot is recorded by plural laser beams. Therefore, theoritically, tone reproduction can be optionally varied by varying exposure pattern due to the laser or output power of the laser. In a conventional CTP printing, conditions of a plate making apparatus have been initialized in order to obtain intended prints.

However, it is necessary to provide a different plate making apparatus or to change plate making conditions, due to kinds or size of printing plate materials. Therefore, when various kinds or sizes of printing plate materials are used, plate making conditions to meet each of their kinds or sizes need to be manually changed in the plate making apparatus used or a plate making apparatus exclusive to each of their kinds or sizes are required.

Further, also in printing employing a printing plate material for CTP, optimum printing conditions are different due to kinds of printing materials such as kinds of printing ink, a dampening solution, printing paper as well as kinds of printing plate materials and image patterns, an operator is required to set printing conditions optimum for each of the printing plate materials, individually.

Since exposure conditions or a balance between a dampening solution and printing ink have a great influence on on-press developability particular in an on-press development type printing plate material, an optimum printing condition is required to be set in order to keep printing quality constant.

However, even if an optimum printing condition is set, individually, some fluctuation of printing quality cannot be prevented on account of product lot change, aging change of printing performance, change of printing performance due to ambient atmosphere such as temperature and humidity, output power change of a light source for exposure, or change of printing conditions.

Generally, printing plate materials of various sizes need to be supplied so as to meet various printing presses used. However, when a printing plate material stock roll is manufactured, the size of the printing plate material manufactured is determined by manufacturing facilities.

The manufactured printing plate material stock roll may comprise quality defects or manufacture faults. Therefore, in order to obtain printing plate materials of plural sizes from a printing plate material stock roll with a specific size, the stock roll must be manufactured to minimize printing plate material waste. Hitherto, manual control is carried out based on dimension information or fault information, which are recorded on paper attached to a printing plate material stock roll, which requires many procedures and is likely to cause errors.

In recent years, in a field such as contactless IC cards, RFID (wireless tag) has been developed. As a wireless tag of low price and compact size is developed, it has been used not only as a card with high added value but as a tool for production control or inventory control of products (see for example Patent document 2 below).

[Patent Document 1]
Japanese Patent O.P.I. Publication No. 2001-96710

[Patent Document 2]
Japanese Patent O.P.I. Publication No. 2003-67883

SUMMARY OF THE INVENTION

An aspect of the invention is to provide a printing plate material, a printing plate material roll, a printing plate manufacturing process, and a printing process, which can minimize variation of printing performance and deterioration of printing quality due to variation of printing performance, and provide prints with constant quality, in printing carried out employing a printing plate material for CTP having a plastic sheet support.

The above aspect can be attained by the structures described below.

A printing plate material product, is provided with:

a printing plate material including a substrate and a image forming layer provided on the substrate; and a wireless memory tag mounted on a part of the printing plate material and including a semiconductor memory and an antenna coil through which data is written in or read from the semiconductor memory, wherein the semiconductor memory stores product data written in at the time of the manufacturing process of the printing plate material product.

(Item 1) A printing plate material comprising a plastic sheet support, and provided thereon, an image formation layer, wherein a wireless tag is provided in a portion of the printing plate material.

(Item 2) The printing plate material-of item 1 above, wherein a hydrophilic layer is further provided on the support, and the image formation layer is a thermosensitive image formation layer which is capable of being developed on a printing press after the printing plate material has been mounted on the printing press.

(Item 3) A printing plate material roll comprising a core and a printing plate material wounded around the core, the printing plate material comprising a plastic sheet support, and provided thereon, an image formation layer, wherein a wireless tag is provided in a portion of the core.

(Item 4) The printing plate material roll of item 3 above, wherein a hydrophilic layer is further provided on the support, and the image formation layer is a thermosensitive image formation layer which is capable of being developed on a printing press after the printing plate material has been mounted on the printing press.

(Item 5) A manufacturing process of a printing plate comprising the steps of collating data stored in the wireless tag provided in the printing plate material of item 1 or 2 above and information data of a plate making apparatus, and calculating the collated data, wherein the manufacturing process is controlled according to the calculated results.

(Item 6) A manufacturing process of a printing plate comprising the steps of collating data stored in the wireless tag provided in the printing plate material roll of item 3 or 4 above and information data of a plate making apparatus, and calculating the collated data, wherein the manufacturing process is controlled based on the calculated results.

(Item 7) The manufacturing process of item 5 above, wherein the data stored-in the wireless tag provided in the printing plate material is sensitivity data of the printing plate material, and the information data of the plate making apparatus are output power conditions of a light source for exposure and ambient atmosphere conditions on exposure.

(Item 8) A manufacturing process of a printing plate, the process comprising the steps of providing a printing plate material roll having a plastic sheet support in a plate making apparatus, cutting the roll into a pre-determined length in the plate making apparatus to obtain a printing plate material, and adhering a wireless tag storing pre-determined data to the printing plate material in the plate making apparatus.

(Item 9) A manufacturing process of a printing plate the process comprising the steps of providing in a plate making apparatus a printing plate material roll having a wireless tag, which stores pre-determined data including plate manufacturing condition information data, manufacturing a printing plate employing the plate manufacturing condition information data, and then storing the employed data in the wireless tag or another wireless tag.

(Item 10) A printing process comprising the steps of controlling printing conditions based on information data stored in a wireless tag adhered to a printing plate.

(Item 11) The manufacturing process of item 6 above, wherein the data stored in the wireless tag provided in the printing plate material is sensitivity data of the printing plate material, and the information data of the plate making apparatus are output power conditions of a light source for exposure and ambient atmosphere conditions on exposure.

(Item 12) A manufacturing process of the printing plate material of claim 1 or 2, information data stored in the wireless tag being product quality information, wherein the manufacturing process is controlled according to the product quality information.

(Item 13) A manufacturing process of the printing plate material of the printing plate material roll of claim 3 or 4, information data stored in the wireless tag being product quality information, wherein the manufacturing process is controlled according to the product quality information.

(Item 14) The manufacturing process of claim 12 or 13, wherein the product quality information comprises dimension information and fault information during manufacture.

The invention provides a printing plate material, a printing plate material roll, a printing plate manufacturing process, and a printing process, which can minimize variation of printing performance and deterioration of printing quality due to variation of printing performance, and provide prints with constant quality.

DETAILED DESCRIPTION OF THE PREFERRED EMBODIMENT

Next, the invention will be explained in detail.

The present inventor has found that control of a process of manufacturing or employing a printing plate by a wireless tag provided on a printing plate material or a printing plate material roll can solve the above problems, and has completed this invention.

A typical embodiment of the invention provides a wireless tag in a portion of a printing plate material or a printing plate material roll each having a plastic sheet support, and controls a process of manufacturing or employing a printing plate by the wireless tag.

The printing plate material of the invention comprises, on a plastic sheet support, an image formation layer which is capable of recording an image by a digital device such as a laser, a thermal head, or an ink jet head, whereby a printing plate is obtained.

Printing plate materials for laser exposure exhibit the effects of the invention, and among them, particularly an on-press development type printing plate material, comprising a hydrophilic layer and a thermosensitive image formation layer, exhibits the excellent effects.

Figure 1:
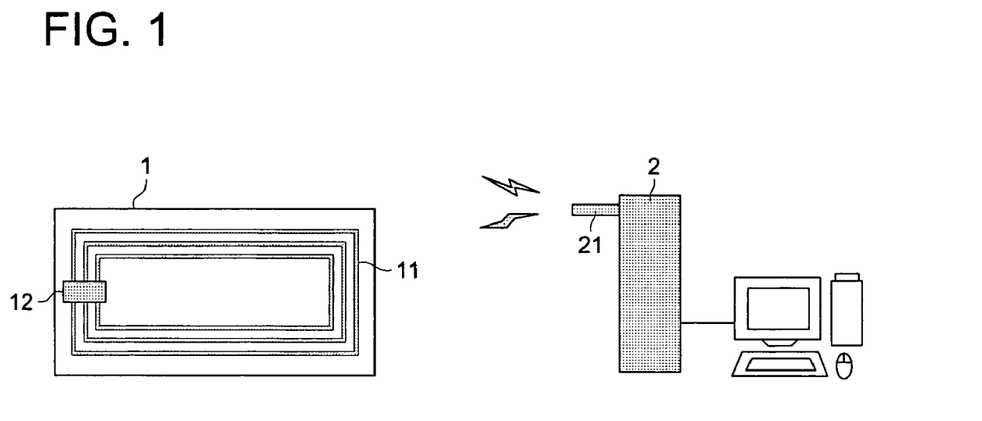
FIG. 1 is an illustration showing a wireless tag and a reader-writer.
Figure 2:
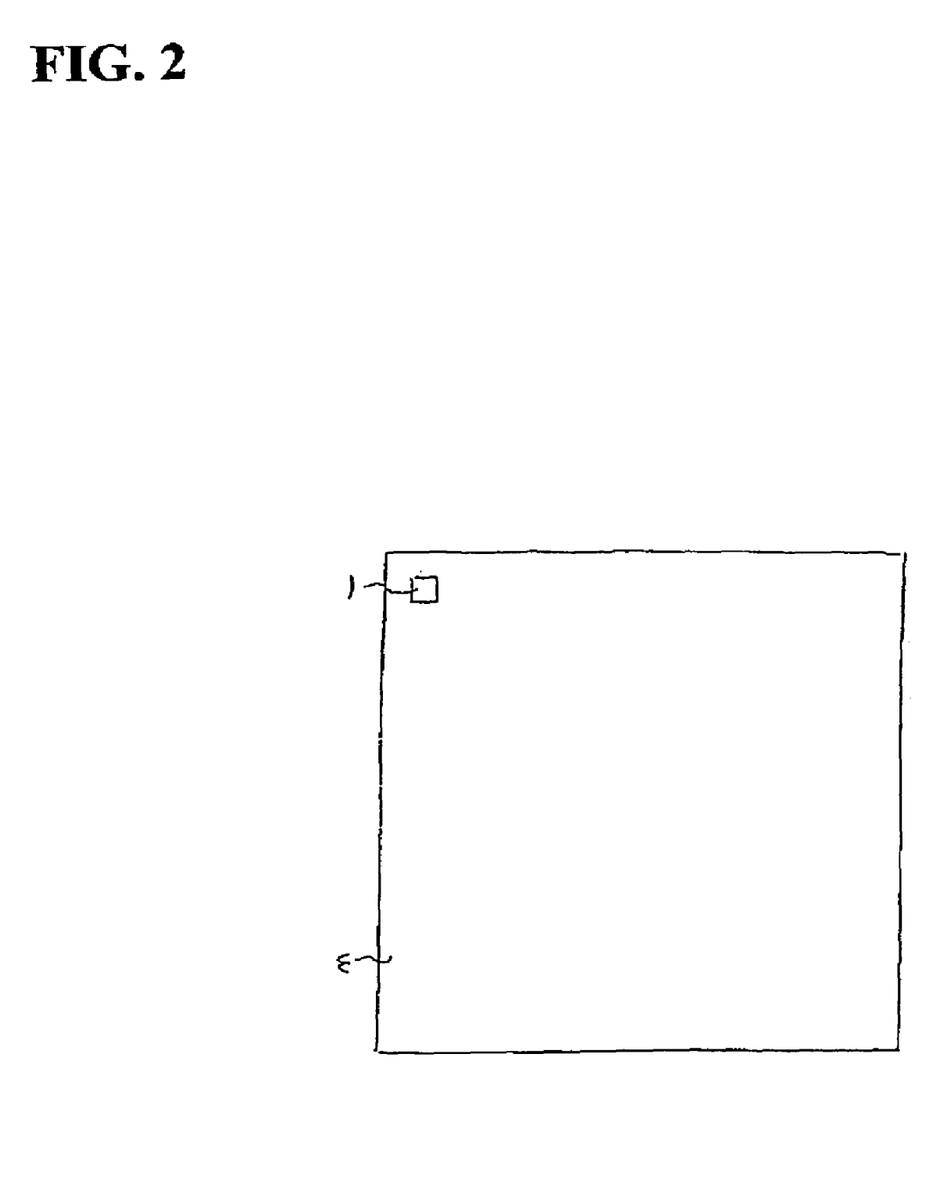
FIG. 2 is an illustration showing the printing plate material containing the wireless tag.

As shown in FIG. 1, the wireless tag 1 in the invention is one comprising at least a semiconductor memory (IC chip) 12 and transmit-receive coil 11 (antenna) in it, which is consttucted so that it can communicate with an outer exclusive reader-writer 2 through an-antenna 21 without contact. FIG. 2 shows a location where wireless tag 1 may be mounted on printing plate material 3.

As a method of providing the wireless tag in the printing plate, printing plate material or printing plate material roll, there is, for example, a method adhering a wireless tag in the form of sticker to an appropriate portion of the printing plate, printing plate material or printing plate material roll. Examples of the wireless tag in the form of sticker include Contactless Smart Label produced by Vansknee Co., Ltd.

A first preferred embodiment of the invention is a printing plate material or printing plate material roll having a wireless tag storing a pre-determined data in advance. Especially preferred is a printing plate material roll in which a printing plate material is wound around a core, and the wireless tag is provided in a portion of the core.

The wireless tag provided in a portion of the core can communicate with a reader-writer installed in a manufacturing apparatus in a successive process. In manufacturing a printing plate, the wireless tag can communicate with a reader-write installed in a plate making apparatus in the printing plate material loaded in the plate making apparatus.

Examples of the data stored in the wireless tag include data specific to a printing plate material such as 1) kinds of the printing plate material, 2) a lot number of products, 3) a size of the printing plate material (e.g., width, length, thickness), 4) date of production (expiration date), 5) exposure condition (output power of light source, a rotation number of an exposure drum), or 6) printing conditions (pre-dampening conditions, printing pressure, a balance of a dampening solution and printing ink), or 7) fault information in manufacture (position, kinds).

As information in manufacture, dimension information and fault information are particularly useful. Examples of the dimension information include the width (for example, support width, effective width, or coated position) and the length (for example, full length, or effective length) of the printing plate material (printing plate material stock roll) in the manufacture. Examples of the fault information include positions, size or kinds of faults.

A method for inputting fault information may be any, but is preferably a method inputting fault information from an inline fault detector provided in a coating line.

A wireless tag storing the information being adhered to a printing plate material roll, a successive manufacturing process (for example, coating or cutting) can be effectively controlled.

Particularly when exposure conditions are stored in each of production lots or each of kinds of a printing plate material not only as simple conditions but as the function with respect to conditions of a plate making apparatus such as ambient temperature and humidity on exposure and output power of exposure, it is possible to determine the plate making condition based on the results which is obtained by collating the information data characteristic of the printing plate material and information data of plate making apparatus conditions, and then calculating the collated data, which enables more precise control in the printing plate manufacture.

In a printing plate material whose printing performance varies with time, storing in the printing plate material a relationship between time which passed after manufacture and optimum plate making conditions as information data characteristic of the printing plate material can cancel the variation of the printing performance.

The process of the invention of manufacturing a printing plate comprises the steps of collating data stored in the wireless tag provided in a printing plate material or in a printing plate material roll and data of a plate making apparatus, calculating the collated data, and then controlling a plate making process based on the calculated results.

As the data of the plate making apparatus, there are, for example, output power conditions of a light source for exposure, ambient atmosphere conditions on exposure, and printing conditions, etc.

When the data stored in the wireless tag provided in the printing plate material is sensitivity of the printing plate material and the data of the plate making apparatus are output power conditions of a light source for exposure and ambient atmosphere conditions on exposure, it provides especially preferable results.

While the printing plate material is treated in the plate making apparatus, additional data can be stored in the wireless tag of the printing plate material. The additional data include 1) the length of the rest of the printing plate material, and 2) the plate making history of the printing plate (time and date of plate making, exposure conditions, and output image data ID).

A second preferred embodiment of the invention is a process of manufacturing a printing plate from a printing plate material roll having a plastic sheet support, wherein the process comprises cutting the printing plate material roll in a plate making apparatus into a pre-determined length in the plate making apparatus to obtain a printing plate material, and providing a wireless tag storing pre-determined information data in the printing plate material in the plate making apparatus. Herein, a reader-writer of a wireless tag and a wireless tag in the form of sticker (hereinafter also referred to as a wireless tag sticker) storing pre-determined information data are provided in the plate making apparatus, and the wireless tag sticker is adhered to each of the printing plate materials cut in a pre-determined length in the plate making apparatus, employing a conventional laminator.

A position of the printing plate material where the wireless tag is adhered is not specifically limited, as long as the position has no influence on printing, but is preferably an edge portion of the printing plate material which corresponds to a portion not more than 20 mm distant from the end in the circumferential direction of a plate cylinder.

The wireless tag sticker provided in the printing plate material has a thickness of preferably not more than 0.1 mm, and more preferably not more than 0.07 mm. The area of the wireless tag sticker is preferably as possible as small, but it is necessary to secure an area of antenna necessary to carry out stable communication. The shape of the wireless tag sticker is preferably a rectangle, and the short side of the rectangle is not more than 25 mm, preferably not more than 15 mm, and more preferably not more than 10 mm.

As the information data stored in the wireless tag provided on every printing plate material, there are, for example, 1) kinds of the printing plate material, 2) a lot number of products, 3) a size of the printing plate material (e.g., width, length, thickness), 4) plate making history (time and date, exposure conditions, output image data ID) or 5) printing conditions.

A part of these information data can be read from the wireless tag provided in the printing plate material roll, and duplicated.

Storing, in the wireless tag, information data as printing conditions such as pre-dampening conditions, printing pressure conditions and an dampening solution supply amount or information data which are obtained by collating the information data and information data such as printing color or image area, which vary due to different printing plate materials and calculating the collated data, enables precise control of printing quality.

Next, the typical printing plate material of the on-press development type used in the invention will be explained.

1) Support

In the invention, as a support, a plastic sheet is used. Thickness of the support is preferably from 150 to 250 μm, and more preferably from 175 to 200 μm, in view of transportability in a printing plate manufacturing device and ease in handling as a printing plate material.

Examples of the plastic sheet include sheets of polyethylene terephthalate, polyethylene naphthalate, polyimide, polyamide, polycarbonate, polysulfone, polyphenylene oxide, and cellulose ester. The plastic sheet is preferably a polyethylene terephthalate sheet or a polyethylene naphthalate sheet.

It is preferred that an anti-static layer is provided on one side or on both sides of the support. When the anti-static layer is provided between the hydrophilic layer and the support, adhesion of the support to the hydrophilic layer is increased. The antistatic layer contains a polymer layer in which metal oxide particles or matting agents are dispersed. Examples of the metal oxides constituting the metal oxide particles include $SiO_2$, $ZnO$, $TiO_2$, $SnO_2$, $Al_2O_3$, $In_2O_3$, $MgO$, $BaO$, $MoO_3$, $V_2O_5$ and a composite thereof, and these metal oxides further containing hetero atoms. These may be used singly or in combination. The preferred metal oxides are $SiO_2$, $ZnO$, $SnO_2$, $Al_2O_3$, $TiO_2$, $In_2O_3$, and $MgO$.

The thickness of the antistatic layer is preferably from 0.01 to 1 μm.

In order to increase adhesion between the plastic sheet support and a hydrophilic layer, the surface of the support may be subjected to corona discharge treatment, flame treatment, plasma treatment and UV light irradiation treatment. The surface can be mechanically roughened according to a sand blast method or a brush roughening method. The plastic sheet is preferably coated with a subbing layer containing latex having a hydrophilic group or a water soluble resin.

2) Hydrophilic Layer

The hydrophilic layer in the invention is preferably a layer in which particles are dispersed in a hydrophilic matrix. Materials preferably used are as follows.

As materials constituting the hydrophilic matrix are preferably used an organic hydrophilic matrix obtained by cross-linking or pseudo cross-linking an organic hydrophilic polymer, an inorganic hydrophilic matrix obtained by sol-to-gel conversion by hydrolysis or condensation of polyalkoxysilane, titanate, zirconate or aluminate, or metal oxides. The hydrophilic matrix layer preferably contains metal oxide particles. Examples of the metal oxide particles include particles of colloidal silica, alumina sol, titania sol and another metal oxide sol. The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred. The colloidal silica has a high layer forming ability under a drying condition with a relative low temperature, and can provide a good layer strength. It is preferred that the colloidal silica used in the invention is necklace-shaped colloidal silica or colloidal silica particles having an average particle size of not more than 20 nm, each being described later. Further, it is preferred that the colloidal silica provides an alkaline colloidal silica solution as a colloid solution.

The hydrophilic matrix in the invention may have a porous structure, and can contain, as porosity providing agents, porous metal oxide particles with a particle size of less than 1 μm. Examples of the porous metal oxide particles include porous silica particles, porous aluminosilicate particles or zeolite particles as described later.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions. The porous silica particles prepared from the gel by the wet method is particularly preferred.

The porosity of the particles is preferably not less than 1.0 ml/g, more preferably not less than 1.2 ml/g, and most preferably of from 1.8 to 2.5 ml/g, in terms of pore volume. The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

Zeolite is a crystalline aluminosilicate, which is a porous material having voids of a regular three dimensional net work structure and having a pore size of 0.3 to 1 nm. Natural and synthetic zeolites can be used.

The uniform matrix having hydrophilicity of the printing plate material of the invention can contain layer structural clay mineral particles. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural-polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available.

Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the planar structural mineral particles, the particles have an average particle size (an average of the largest particle length) of preferably not more than 20 μm, and more preferably not more than 10 μm, and an average aspect ratio (the largest particle length/the particle thickness of preferably not less than 20, and more preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect. The particle size greater than the foregoing may produce a non-uniform coated layer, resulting in poor layer strength. The aspect ratio lower than the foregoing reduces the planar particles, resulting in insufficient viscosity increase and reduction of particle sedimentation inhibiting effect.

The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate can be used as another additive in the uniform matrix having hydrophilicity in the invention. An alkali metal silicate such as sodium silicate, potassium silicate or lithium silicate is preferable, and the $SiO_2/M_2O$ is preferably selected so that the pH value of the coating liquid after addition of the silicate does not exceed 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

A water soluble resin may be contained in the matrix in the invention. Examples of the water soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the invention, polysaccharides are preferably used as the water soluble resin.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer in the invention preferably has a convexoconcave structure having a pitch of from 0.1 to 50 μm such as the grained aluminum surface of an aluminum PS plate. The water retention ability and the image maintaining ability are raised by such a convexoconcave structure of the surface. Such a convexoconcave structure can also be formed by adding in an appropriate amount of particles having a suitable particle size to the coating liquid of the hydrophilic layer, or by coating a coating liquid for the hydrophilic layer containing the alkaline colloidal silica and the water-soluble polysaccharide so that the phase separation occurs at the time of drying the coated liquid.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

As particles used in the invention, there are well-known metal oxide particles such as particles of silica, alumina, titania and zirconia; and resin particles polymethyl methacrylate, melamine and polystyrene whose surface is coated with inorganic material to be hydrophilic.

The inorganic material-coated particles include particles in which organic particles such as polymethyl methacrylate particles, polystyrene particles or melamine particles form cores and the cores are covered with inorganic particles having a size smaller than that of the cores. The particle size of the inorganic particles is preferably from $\frac{1}{10}$ to $\frac{1}{100}$ of that of the cores. Further, well-known metal oxide particles such as particles of silica, alumina, titania and zirconia can be used as the inorganic particles. There are various covering methods, but a dry covering method is preferred in which the cores collide with the covering materials at high speed in air as in a hybridizer for the covering materials to penetrate the surface of the cores and fix them there.

These particles may be used singly or in combination thereof.

The average particle diameter of the particles is preferably not less than 1 μm. The maximum average particle diameter of the particles, which protrude from the hydrophilic layer, is from 4 to 10 μm.

When the particle diameter exceeds 10 μm, it may lower dissolution of formed images or result in contamination of blanket during printing the content of the particles in the hydrophilic layer is preferably from 1 to 50% by weight, and more preferably from 5 to 40% by weight.

In the invention, a hydrophilic layer and an image formation layer in laminate is a hydrophilic layer and an image formation layer provided in that order on a support, provided that another layer may be provided between the nearest two layers of those layers.

The hydrophilic layer may be a single layer or plural layers.

In the invention, the hydrophilic layer, intermediate hydrophilic layer or another layer can contain a light-to-heat conversion material. As the light-to-heat conversion materials, infrared absorbing dyes, inorganic or organic pigment and metal oxides are preferably used. Typical examples thereof are as follows.

Examples of the infrared absorbing dyes include organic compounds such as a cyanine dye, a chloconium dye, a polymethine dye, an azulenium dye, a squalenium dye, a thiopyrylium dye, a naphthoquinone dye and an anthraquinone dye; and organometallic complexes of phthalocyanine type, naphthalocyanine type, azo type, thioamide type, dithiol type or indoaniline type. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm. The graphite is one having a particle size of preferably not more than 0.5 µm, more preferably not more than 100 nm, and most preferably not more than 50 nm. As the metal, any metal can be used as long as the metal is in a form of fine particles having preferably a particle size of not more than 0.5 µm, more preferably not more than 100 nm, and most preferably not more than 50 nm. The metal may have any shape such as spherical, flaky and needle-like. Colloidal metal particles such as those of silver or gold are particularly preferred. As the metal oxide, materials having black color in the visible regions, or electro-conductive materials or semi-conductive materials can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3 \cdot 2B_2O$ and $K_2O \cdot nTiO_2$ with these metal oxides is usable. The particle size of these particles is not more than 0.5 µm, preferably not more than 100 nm, and more preferably not more than 50 nm.

Of these light-to-heat conversion materials, black iron oxide and black complex metal oxides containing at least two metals are preferred. Examples of the latter include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light-to-heat conversion efficiency as compared with another metal oxide.

The primary average particle size of these metal oxide light-to-heat conversion materials is preferably not more than 1 µm, and more preferably from 0.01 to 0.5 µm. The primary average particle size of not more than 1 µm improves light-to-heat conversion efficiency relative to the addition amount of the particles, and the primary average particle size of from 0.05 to 0.5 µm further improves light-to-heat conversion efficiency relative to the addition amount of the particles. The light-to-heat conversion efficiency relative to the addition amount of the particles depends on a dispersity of the particles, and the well-dispersed particles have high light-to-heat conversion efficiency. Accordingly, these metal oxide light-to-heat conversion materials are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of metal oxide particles. The addition amount of the metal oxide particles is preferably 0.1 to 60% by weight, more preferably 3 to 60% by weight, and most preferably 3 to 45% by weight based on the weight of the hydrophilic layer or under layer.

The content of the light-to-heat conversion material in the hydrophilic layer may be different from that in the intermediate hydrophilic layer.

3) Image Formation Layer

The image formation layer in the invention is a layer capable of forming image portions receptive to printing ink and non-image portions repulsive to printing ink, and preferably a thermosensitive image formation layer.

The thermosensitive image formation layer in the invention is a layer on which an image is formed by heating, and preferably an image formation layer containing heat melt particles and/or heat fusible particles. The heating methods include a method in which heating is directly carried out employing a heat source or a method employing heat generated by light exposure such as laser exposure. In the invention, imagewise exposure is preferably carried out employing a laser.

The heat melt particles are particularly particles having a low melt viscosity, or particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to contaminations which may be caused by scratch is further enhanced.

The heat melt particles are preferably dispersible in water. The average particle size thereof is preferably from 0.01 to 10 µm, and more preferably from 0.1 to 3 µm. When a layer containing the heat melt particles is coated on a porous hydrophilic layer described later, the particles having an average particle size less than 0.01 µm may enter the pores of the hydrophilic layer or the valleys between the neighboring two peaks on the hydrophilic layer surface, resulting in insufficient on press development and background contaminations. The particles having an average particle size exceeding 10 µm may result in lowering of dissolving power.

The composition of the heat melt particles may be continuously varied from the interior to the surface of the particles. The particles may be covered with a different material. Known microcapsule production method or sol-gel method can be applied for covering the particles.

The heat melt particle content of the thermosensitive image formation layer is preferably 1 to 90% by weight, and more preferably 5 to 80% by weight based on the total layer weight.

The heat fusible particles used in the invention include particles of a thermoplastic hydrophobic polymer. There is no specific limitation to the upper limit of the softening point of the thermoplastic hydrophobic polymer. It is preferred that the softening point of the thermoplastic hydrophobic polymer is lower than the decomposition temperature of the polymer. The weight average molecular weight (Mw) of the polymer is preferably within the range of from 10,000 to 1,000,000.

Examples of the thermoplastic hydrophobic polymer constituting the particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co) polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co) polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer; the (meth)acrylic acid (co)polymer, the vinyl ester (co)polymer, the polystyrene and the synthetic rubbers are preferably used.

The hydrophobic polymer may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 µm, and more preferably from 0.1 to 3 µm. When a layer containing the heat fusible particles having an average particle size less than 0.01 µm is coated on the porous hydrophilic layer, the particles may enter the pores of the hydrophilic layer or the valleys between the neighboring two peaks on the hydrophilic layer surface, resulting in insufficient on press development and background contaminations. The heat fusible particles having an average particle size exceeding 10 µm may result in lowering of dissolving power.

Further, the composition of the heat fusible particles may be continuously varied from the interior to the surface of the particles. The particles may be covered with a different material. As a covering method, known methods such as a microcapsule method and a sol-gel method are usable.

The heat fusible particle content of the thermosensitive image formation layer is preferably from 1 to 90% by weight, and more preferably from 5 to 80% by weight based on the total weight of the layer.

In the invention, the image formation layer containing heat melting particles or heat fusible particles can further contain a water soluble material. When an image formation layer at unexposed portions is removed on a press with dampening solution or ink, the water soluble material makes it possible to easily remove the layer.

Regarding the water soluble material, those described above as water soluble materials to be contained in the hydrophilic layer can be used. The image formation layer in the invention preferably contains saccharides, and more preferably contains oligosaccharides.

Among the oligosaccharides, trehalose with comparatively high purity is available on the market, and has an extremely low hygroscopicity, although it has high water solubility, providing excellent storage stability and excellent development property (on-press development) on a printing press.

When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring. In order to attain the object of the invention, trehalose is preferable among oligosaccharides.

The oligosaccharide content of the thermosensitive image formation layer is preferably from 1 to 90% by weight, and more preferably from 10 to 80% by weight, based on the total weight.

4) Back Coat Layer

A back coat layer may be provided on the rear surface of the printing plate material of the invention in order to obtain desired smoothness, coefficient of static friction and electroconductivity. It is preferred that the back coat layer contains a compound providing desired surface lubricity or coefficient of static friction, in addition to a binder, and a matting agent.

Examples of the binder include gelatin, polyvinyl alcohol, methylcellulose, acetylcellulose, aromatic polyamides, silicone resins, alkyd resins, phenol resins, melamine resins, fluorine-contained resins, polyimides, urethane resins, acryl resins, urethane-modified silicone resins, polyethylene, polypropylene, Teflon (R), polyvinyl butyral, polyvinyl chloride, polyvinyl acetate, polycarbonates, organic boron compounds, aromatic esters, fluorinated polyurethane, polyether sulfone, polyesters, polyamides, polystyrene, and a copolymer containing as a main component a monomer unit contained in the resins or polymers described above.

Use of a cross-linked polymer as a binder is effective in preventing separation of the matting agent or improving scratch resistance in the back coat layer, and is effective for preventing blocking during storage. As the cross-linking method of the binder, heat, actinic light, pressure or their combination can be employed according to kinds of the cross-linking agent used, without special limitations. In order to improve adhesion of the support, an adhesive layer may be provided between the support and the back coat layer.

Examples of the matting agent preferably used in the back coat layer include inorganic or organic particles. Examples of the organic particles include particles of silicone resins, fluorine-contained resins, acryl resins, methacryl resins, melamine resins, polystyrene resins, polyethylene resins, polypropylene resins, another radical polymerization polymer, and polycondensation resins such as polyesters and polycarbonates. Of these, particles of silicone resins, acryl resins, and methacryl resins are more preferred.

Examples of the inorganic particles include particles silicon oxide, calcium carbonate, titanium dioxide, aluminum oxide, zinc oxide, barium sulfate, and zinc sulfate. Of these, titanium dioxide, calcium carbonate, and silicon oxide are preferred.

The average particle diameter of the matting agent particles is preferably from 0.5 to 10 µm, and more preferably from 0.8 to 5 µm. The average particle diameter less than 0.5 µm cannot provide a sufficiently roughened back coat layer surface, requiring long evacuation time to uniformly fix the printing plate material to a fixing member. The average particle diameter exceeding 10 µm provides an excessively roughened back coat layer surface and a high smoother value, so that the printing plate material cannot be stably fixed to a fixing member.

A back coat layer is provided on a plastic sheet support in a coating amount of preferably from 0.5 to 5 g/m$^2$, and more preferably from 0.5 to 3.0 g/m$^2$. In the back coat layer in a coating amount of less than 0.5 g/m$^2$, coatability is unstable, causing problem of matting agent separation. In the back coat layer in a coating amount exceeding 5 g/m$^2$, the particle diameter of the matting agent increases, and produces embossing on the image formation layer side due to pressure from the back coat layer, resulting in lack or unevenness of images.

The matting agent particle content of the back coat layer is preferably 0.5 to 50% by weight, and more preferably from 1 to 20% by weight, based on the total solid content of the back coat layer. The particle content of less than 0.5% by weight may not provide a sufficiently roughened back coat layer surface. The particle content exceeding 50% by weight provides an excessively roughened back coat layer surface and a smoother value falling outside the range defined in the invention, which may lower image quality.

The back coat layer preferably contains various surfactants, silicone oil, a fluorine-contained resin, or waxes, in order to improve lubricity of the surface.

An antistatic agent can be added to the back coat layer, in order to prevent transportation fault due to frictional electrification or adherence of foreign matter due to the electrification. Examples of the antistatic agent include a cationic surfactant, an anionic surfactant, a nonionic surfactant, a polymer antistatic agent, and electrically conductive particles. Of these, carbon black, graphite, particles of metal oxides such as tin oxide, zinc oxide or titanium oxide, or a conductive particles of semiconductors are preferably used. Carbon black, graphite, or particles of metal oxides are especially preferred, since a stable antistatic property can be obtained free from ambient atmosphere conditions such as temperature.

Examples of the metal oxides constituting the metal oxide particles include $SiO_2$, $ZnO$, $TiO_2$, $SnO_2$, $Al_2O_3$, $In_2O_3$, $MgO$, $BaO$, $MoO_3$, $V_2O_5$ and a composite thereof, and metal oxides containing a hetero atom. These may be used singly or in combination. The preferred metal oxides of these are $SiO_2$, $ZnO$, $SnO_2$, $Al_2O_3$, $TiO_2$, $In_2O_3$, and $MgO$. Examples of the metal oxides containing a hetero atom include $ZnO$ doped with a hetero atom such as Al or In, $SnO_2$ doped with a hetero atom such as Sb or Nb, and $In_2O_3$ doped with a hetero atom such as Sn, in which the doping content of the hetero atom is not more than 30 mol %, and more preferably not more than 10 mol %.

The metal particle content of the back coat layer is preferably from 10 to 90% by weight. The average particle size of the metal particles is preferably from 0.001 to 0.5 µm. The average particle size of the metal particles herein refers to that of the metal particles including primary order particles and higher order particles.

The printing plate material of the on-press development type of the invention preferably comprises a layer or a support each having a specific surface resistance of from $1\times10^8$ to $1\times10^{12}$ $\Omega/m^2$ at 80% RH. Anti-static agents are preferably used. Various surfactants or electrically conductive materials as the anti-static agents are suitably used in the layer so that the layer has specific surface resistance of from $1\times10^8$ to $1\times10^{12}$ $\Omega/m^2$ at 80% RH. It is preferred that carbon black, graphite, or particles of metal oxides are added to a layer so that the layer has a specific surface resistance of from $1\times10^8$ to $1\times10^{12}$ $\Omega/m^2$ at 80% RH.

When the printing plate material of the invention on the fixing member is exposed to laser, the printing plate material is preferably fixed on the fixing member so that displacement of the printing plate material is not caused, employing a combination of a vacuum suction method and another known method. In order to prevent blocking or to provide good fixation, the rear surface of the support is preferably roughened or is preferably provided with a back coat layer containing a matting agent. Such a rear surface has a surface roughness (Rz) of preferably from 0.04 to 5.00 µm.

The smoother value of the back coat layer of the printing plate material is preferably not more than 0.06 MP, and more preferably from 0.0003 to 0.06 MP. The smoother value less than 0.0003 MP lowers uniform fixing on a fixing member and requires long time to obtain stable fixation. The smoother value more than 0.06 MP results in insufficient fixing and results in instable exposure.

A coefficient of static friction between the back coat layer and the fixing member surface is preferably from 0.2 to 0.6. A coefficient of static friction less than 0.2 and a coefficient of static friction more than 0.6, both lower fixing accuracy.

One embodiment of the image formation method in the invention will be explained below.

Image formation on the printing plate material of the invention can be carried out by applying heat, and is carried out preferably by infrared ray exposure.

In the invention, exposure for image formation is preferably scanning exposure, which is carried out employing a laser which can emit light having a wavelength of infrared and/or near-infrared regions, that is, a wavelength of from 700 to 1000 nm. As the laser, a gas laser can be used, but a semi-conductor laser, which emits light having a near-infrared region wavelength, is preferably used.

A device suitable for the scanning exposure in the invention may be any device capable of forming an image on the printing plate material according to image signals from a computer employing a semi-conductor laser.

Generally, the scanning exposures include the following processes.

(1) a process in which a plate material provided on a fixed horizontal plate is scanning exposed in two dimensions, employing one or several laser beams.

(2) a process in which the surface of a plate material provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate material provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate material mounted on a plate cylinder of a printing press is scanning exposed.

(On-Press Development)

In the invention, the image formation layer capable of being developed on a printing press is a layer in which an image formation layer at non-image portions are removed by supplying dampening solution and/or printing ink to the image formation layer on the press before printing.

Removal on a press of the image formation layer at non-image portions (unexposed portions) of a printing plate material, which is mounted on the plate cylinder, can be carried out by bringing a dampening roller and an inking roller into contact with the image formation layer while rotating the plate cylinder, and can be also carried out according to various sequences such as those described below or another appropriate sequence. The supplied amount of dampening solution may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

As a printing press, a conventional off-set printing press for a planographic printing plate is employed.

EXAMPLES

The present invention will be detailed employing the following examples, but the invention is not limited thereto. In the examples, "parts" is parts by weight, unless otherwise particularly specified.

Example 1

<Preparation of Polyethylene Terephthalate Support>

Employing terephthalic acid and ethylene glycol, polyethylene terephthalate having an intrinsic viscosity VI of 0.66 (at 25° C. in a phenol/tetrachloroethane (6/4 by weight) solvent) was prepared according to a conventional method. The resulting polyethylene terephthalate was formed into pellets, dried at 130° C. for 4 hours, and melted at 300° C. The melted polyethylene terephthalate was extruded from a T-shaped die to obtain an unstretched film sheet. The resulting film sheet was biaxially heat-stretched at a specific temperature to obtain a polyethylene terephthalate support with a thickness of 175±3 μm.

(Subbing Layer Formation)

The both surfaces of the support obtained above were corona discharged under condition of 8 W/m²·minute. Then, the surface on one side of the support was coated with the following subbing layer coating solution (a) to give a first subbing layer with a dry thickness of 0.8 μm, and then coated with the following subbing layer coating solution (b) to give a second subbing layer with a dry thickness of 0.1 μm, while the first subbing layer was corona discharged under condition of 8 W/m²·minute, each layer was dried at 180° C. for 4 minutes (subbing layer A was formed).

Successively, the surface on the other side of the resulting support was coated with the following subbing layer coating solution (c) to give a third subbing layer with a dry thickness of 0.8 μm, and then coated with the following subbing layer coating solution (d) to give a fourth subbing layer with a dry thickness of 1.0 μm, while the third subbing layer was corona discharged under condition of 8 W/m²·minute, each layer was dried at 180° C. for 4 minutes (subbing layer B was formed).

The surface roughness Ra of the surface on the subbing layer B side was 0.8 μm.

<<Subbing Layer Coating Solution (a)>>

| | |
|---|---|
| Latex of styrene/glycidyl methacrylate/butyl acrylate (60/39/1) copolymer (Tg = 75° C.) | 6.3 parts |
| Latex of styrene/glycidyl methacrylate/butyl acrylate (20/40/40) copolymer | 1.6 parts |
| Anionic surfactant S-1 | 0.1 parts |
| Water | 92.0 parts |

<<Subbing Layer Coating Solution (b)>>

| | |
|---|---|
| Gelatin | 1.0 part |
| Anionic surfactant S-1 | 0.05 parts |
| Hardener H-1 | 0.02 parts |
| Matting agent (Silica particles with an average particle size of 3.5 μm) | 0.02 parts |

-continued

| | |
|---|---|
| Antifungal agent F-1 | 0.01 parts |
| Water | 98.9 parts |
| <<Subbing Layer Coating Solution (c)>> | |
| Latex of styrene/glycidyl methacrylate/butyl acrylate (20/40/40) copolymer | 0.4 parts |
| Latex of styrene/glycidyl methacrylate/butyl acrylate/acetoacetoxyethyl methacrylate (39/40/20/1) copolymer | 7.6 parts |
| Anionic surfactant S-1 | 0.1 parts |
| Water | 91.9 parts |
| <<Subbing Layer Coating Solution (d)>> | |
| Conductive composition of | 6.4 parts |
| * Component d-11/Component d-12/Component d-13 (= 66/31/1) | |
| Hardener H-2 | 0.7 parts |
| Anionic surfactant S-1 | 0.07 parts |
| Silica particles with an average particle size of 3.5 μm | 0.03 parts |
| Water | 93.4 parts |

* Component d-11:
Copolymer of styrene sulfonic acid/maleic acid (50/50) (Anionic polymer)
* Component d-12:
Latex of styrene/glycidyl methacrylate/butyl acrylate (20/40/40) copolymer
* Component d-13:
Copolymer of styrene/sodium isoprene sulfonate (80/20) (Polymer surfactant)

S-1

H-1

F-1

(Component A)

(Component B)

(Component C)

(Component A):(Component B):(Component C)=50:46:4 (by mole)

Mixture of three compounds below (Preparation of Printing Plate Material)

A hydrophilic layer 1 coating solution as shown in Table 1, a hydrophilic layer 2 coating solution as shown in Table 2, an image formation layer coating solution as shown in Table 3, and a back coat layer coating solution as shown in Table 4 were coated on the surface of the subbed support described above, employing a wire bar. Thus, a printing plate material was prepared.

As the support, a sheet support with a width of 1,260 mm and a length of 3000 m was used. The resulting printing plate material was wound around a resin core with an inner diameter of 150 mm to obtain a printing plate material roll.

Dimension information (support width, effective product width, coating position in the transverse direction, product length, effective product length, effective coating position in the mechanical direction) and position, kinds, and size of faults detected by an inline fault detector were stored in a wireless tag sticker, and the wireless tag sticker was adhered to the core.

In the above, the hydrophilic layer 1 coating solution and the hydrophilic layer 2 coating solution (Table 1) were coated on the surface of the subbing layer A side with a wire bar in that order to obtain a hydrophilic layer 1 with a dry thickness of 3.0 g/m$^2$ and a hydrophilic layer 2 with a dry thickness of 0.6 g/m$^2$, dried at 120° C. for 1 minutes, and then heat treated at 60° C. for 4 hours. Thereafter, the back coat layer coating solution was coated on the surface of the subbing layer B side with a wire bar to obtain a back coat layer with a dry thickness of 2.0 g/m$^2$, dried at 120° C. for 30 seconds. Subsequently, the image formation layer coating solution was coated on the hydrophilic layer 2 with a wire bar to obtain an image formation layer with a dry thickness of 0.5 g/m$^2$, dried at 70° C. for 1 minute, and then subjected to seasoning treatment at 50° C. for 48 hours.

<<Hydrophilic Layer 1 Coating Solution>>

Materials as shown in Table 1 were sufficiently mixed in the amounts shown in Table 1 while stirring, employing a homogenizer, and filtered to obtain hydrophilic layer 1 coating solution. Details of the materials are shown in Table 1, and in Table 1, numerical values represent parts by weight.

TABLE 1

| Materials | |
|---|---|
| Colloidal silica (alkali type): Snowtex XS (solid 20% by weight, produced by Nissan Kagaku Co., Ltd.) | 240.5 |
| Colloidal silica (alkali type): Snowtex ZL (solid 20% by weight, produced by Nissan Kagaku Co., Ltd.) | 15 |
| Matting agent: STM-6500S produced by Nissan Kagaku Co., Ltd. (spherical particles comprised of melamine resin as cores and silica as shells with an average particle size of 6.5 μm and having a convexo-concave surface) | 15 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant) } | 50 |
| Layer structural clay mineral particles: Montmorillonite, Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 22 |
| Water soluble resin: aqueous 4% by weight sodium carboxymethyl cellulose solution (Reagent produced by Kanto Kagaku Co., Ltd.) | 15 |
| pH adjusting agent: aqueous 10% by weight sodium phosphate · dodecahydrate solution (Reagent produced by Kanto Kagaku Co., Ltd.) | 3 |
| Matting agent: Silton JC 40 (porous aluminosilicate particles having an average particle size of 4 μm, produced by Mizusawa Kagaku Co., Ltd.) | 11 |
| Silicon-containing surfactant: FZ-2163 (produced by Nippon Unicar Co., Ltd.) | 1 |
| Pure water | 127.5 |

<<Hydrophilic Layer 2 Coating Solution>>

Materials as shown in Table 2 were sufficiently mixed in the amounts shown in Table 2 while stirring, employing a homogenizer, and filtered to obtain hydrophilic layer 2 coating solution. Details of the materials are shown in Table 2, and in Table 2, numerical values represent parts by weight.

TABLE 2

| Materials | |
|---|---|
| Colloidal silica: Snowtex S (solid 30% by weight, produced by Nissan Kagaku Co., Ltd.) | 43.3 |
| Colloidal silica with a large particle size: MP-4540 (solid 40% by weight, produced by Nissan Kagaku Co., Ltd.) | 37.5 |
| Necklace shaped colloidal silica (alkali type): Snowtex PSM (solid 20% by weight, produced by Nissan Kagaku Co., Ltd.) | 97.5 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant) } | 22.5 |
| Layer structural clay mineral particles: Montmorillonite: Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 40 |
| Aqueous 4% by weight sodium carboxymethyl cellulose solution (Reagent produced by Kanto Kagaku Co., Ltd.) | 5 |
| Aqueous 10% by weight sodium phosphate·dodecahydrate solution (Reagent produced by Kanto Kagaku Co., Ltd.) | 5 |
| Porous metal oxide particles Silton AMT 08 (porous aluminosilicate particles having an average particle size of 0.6 μm, produced by Mizusawa Kagaku Co., Ltd.) | 30 |

TABLE 2-continued

| Materials | |
|---|---|
| Porous metal oxide particles Silton JC 20 (porous aluminosilicate particles having an average particle size of 2 μm, produced by Mizusawa Kagaku Co., Ltd.) | 10 |
| Pure water | 522.5 |

<<Preparation of Image Formation Layer Coating Solution>>

TABLE 3

| Materials | |
|---|---|
| Aqueous solution of sodium polyacrylate (water soluble resin, average molecular weight: 300,000) AQUALIC DL422 (solid content 35%), produced by Nippon Shokubai Co., Ltd. | 21.4 |
| Microcrystalline wax emulsion A206 (solid content: 40% by weight, average particle size of 0.5 μm, produced by GIfUSHELLAC Co., Ltd.) | 62.5 |
| Dispersion prepared by diluting with pure water carnauba wax emulsion A118 (having a solid content of 40% by weight, the wax having an average particle size of 0.3 μm, a melting viscosity at 140° C. of 8 cps, a softening point of 65° C., and a melting point of 80° C., produced by GIfUSHELLAC Co., Ltd.) to give a solid content of 5% by weight | 156.3 |
| Pure water | 759.8 |

<<Preparation of Back Coat Layer Coating Solution>>

TABLE 4

| Materials | Parts by weight |
|---|---|
| Binder: Acryl resin latex LE-1043 (solid content 36% by weight, produced by Dainippon Ink Manufacturing Co., Ltd. | 194 |
| Binder: Colloidal silica Snowtex XS (solid content 20% by weight, produced by Nissan Kagaku Co., Ltd.) | 125 |
| Matting agent: PMMA resin particle dispersion solution (average particle size 5.5 μm, solid content 45% by weight) | 11 |
| Pure water | 670 |

The resulting printing plate material obtained above was cut into a size of 745 mm (width)×32 m (length), and wound around a core having an inside diameter of 72 mm, made of cardboard with a thickness of 2.5 mm. Thus, a printing plate material roll sample was prepared.

Portions having faults were automatically removed by a cutter based on information data stored in the wireless tag provided in the core of the printing plate material roll.

A wireless tag sticker (Contactless Smart Label produced by Vansknee Co., Ltd., antenna size: 15×45 mm), storing the following information data, was adhered to the inside walls of the core.

1) Kinds of printing plate material

2) Lot number of products

3) Size (745 mm×650 mm×0.18 mm) of printing plate material

4) Date of production

5) Exposure conditions (exposure properties of the printing plate material obtained above were measured in advance, and a table of ambient atmosphere conditions on exposure (temperature and humidity) and a table of the elapsed time since production as shown below was stored in the wireless tag sticker.)

Table of ambient atmosphere conditions (temperature and humidity)

TABLE 5

| Humidity on plate making | Temperature on plate making | | | | |
|---|---|---|---|---|---|
| | 15–18° C. | 18–21° C. | 21–24° C. | 24–27° C. | 27–30° C. |
| ≦20% RH | 480 | 490 | 490 | 500 | 500 |
| 20–40% RH | 480 | 490 | 510 | 510 | 510 |
| 40–60% RH | 480 | 490 | 500 | 510 | 520 |
| 60–80% RH | 480 | 490 | 500 | 510 | 530 |
| ≧80% RH | 490 | 500 | 510 | 520 | 540 |

In table, the numerical values represent the number of revolutions (rpm) of exposure drum used.

Table of elapsed time since production

| Elapsed time since production | Less than 3 months | 3 to 6 months | 6 to 12 months | 12 to 18 months |
|---|---|---|---|---|
| Increment of the number of revolutions | 0 | 0 | +10 | +20 |

In table, the numerical values represent increment of the number of revolutions (rpm) of exposure drum used.

(Printing Plate Preparation 1)

The printing plate material was exposed employing a plate making apparatus equipped with an exposure drum with a diameter of 300 mm and a width of 850 mm and with a laser exposure head emitting 808 nm beams with a spot diameter of 18 μm. The exposure drum had on the surface suction holes for fixing a printing plate material on the drum.

The plate making apparatus was installed with a reader-writer for reading and writing data stored in the wireless tag, a temperature and humidity sensor for measuring ambient atmosphere on exposure, and a clock for calculating the elapsed time since production of the printing plate material.

Referring to data of the printing plate material read by the reader-writer, data of the exposure ambient atmosphere measured in the plate making apparatus, and the elapsed time since production, exposure conditions were automatically determined based on the Tables above, and exposure was carried out.

In order to confirm effects, the ambient atmosphere conditions on exposure were set to three conditions 18° C. and 30% RH, 23° C. and 55% RH, and 28° C. and 80% RH, and five evaluations (total 15 evaluations) were carried out at each condition, and the five measurements were averaged.

(Printing Plate Preparation 2)

Employing a wireless tag sticker laminator provided in the plate making apparatus, a wireless tag sticker storing the following information data was adhered to each of printing plate material exposed.

A wireless tag sticker (Contactless Smart Label produced by Vansknee Co., Ltd., antenna size: 15×45 mm), storing the following information data, was adhered to the inside walls of the core.

1) Kinds of printing plate material
2) Lot number of products
3) Size of printing plate material (745 mm×650 mm×0.18 mm)
4) Plate making history (time and date of plate making, exposure conditions, and image data ID).
5) Printing conditions (pre-dampening condition)

The pre-dampening condition (the number of revolutions of a dampening roller) was pre-determined based on the exposure resolution of a printing plate and the image area rate as shown in the following Table, and stored in the wireless tag sticker adhered to printing plate material.

TABLE 6

| Image area rate | Exposure resolution | | |
|---|---|---|---|
| | 1000–1800 dpi | 1800–2400 dpi | ≧2400 dpi |
| 0–5% | 3 | 4 | 5 |
| 5–30% | 5 | 6 | 8 |
| 30–50% | 6 | 8 | 8 |
| More than 50% | 6 | 8 | 10 |

(Evaluation of Printing Plate)

Employing the printing plate preparations 1 and 2 above, samples A through D for evaluation having the following conditions were prepared. Employing the samples A through D, printing was carried out under conditions as shown below, and the samples were evaluated for various properties as a printing plate. Two kinds of printing ink described below were used. Position of the wireless tag in each sample is as follows:

A: The wireless tag sticker was adhered only to the core of the printing plate material roll.
B: The wireless tag sticker was adhered only to each of printing plate materials
C: The wireless tag sticker was adhered to both the core of the printing plate material roll and each of printing plate materials.
D: The wireless tag was adhered nowhere.
Printing Press: DAIYA 1F-1 (produced by Mitsubishi Jukogyo Co., Ltd.)
Printing paper: Mu Coat (104.7 g/m$^2$) (produced by Hokuetsu Seishi Co., Ltd.)

In the evaluation, pre-dampening condition was manually set based on the data in the wireless tag. (standard: 5 times)
Dampening solution: a 2% by weight solution of Astromark 3 (produced by Nikken Kagaku Kenkyusyo Co., Ltd.)
Printing ink: TK Hyecho SOY 1 (soy bean oil ink, produced by Toyo Ink Manufacturing Co.)

(Evaluation)

1) On-Press Developability

Printing was carried and the number of printing paper sheets printed from when printing started after pre-dampening to when filling-up at 95% shadow portions was completely removed were determined. Evaluation was made on the printing plate prepared under each ambient atmosphere condition on exposure.
A: No filling-up was observed.
B: The number was from 1 to less than 5.
C: The number was more than 5.

2) Dot Gain Variation

Dot percentage at the 50% dot portion of a fifth print from when printing started was measured. The dot percentage of 15 samples was measured and its variation was calculated.
A: The average±not more than 0.5%
B: The average±0.5–1.5%
C: The average±not less than 1.5%

3) Printing Durability

The number of printing paper sheets printed from when printing started till when a 3% dot image lacked not less than 50% of the dots was counted as printing durability. Printing durability of fifteen samples was evaluated, and its variation was calculated.

A: Less than 5%
B: 5 to less than 10%.
C: Not less than 10%

The results are shown in Table 7.

As is apparent from table 7, prints with constant quality can be obtained according to the printing plate material, the printing plate material roll, the printing plate manufacturing process and the printing process of the invention.

TABLE 7

| Samples | On-Press Developability | Dot Gain Variation | Printing Durability | Remarks |
|---|---|---|---|---|
| A | C | A | A | Inventive |
| B | A | B | A | Inventive |
| C | A | A | A | Inventive |
| D | C | C | C | Comparative |

What is claimed is:

1. A printing plate material product, comprising:
   a printing plate material including a substrate and an image forming layer on which an image is formed, provided on the substrate;
   a core, wherein the substrate is a plastic film, the printing plate material is shaped in a roll type printing plate material and the roll type printing plate material is wound around the core; and
   a wireless memory tag mounted on a part of the core and including a semiconductor memory and an antenna coil through which product data regarding the printing plate material is written in and read from the semiconductor memory;
   wherein the semiconductor memory stores product data written in at the time of the manufacturing process of the printing plate material product, the product data include manufacturing process data, the manufacturing process data includes defect data indicating a position of a defect on the roll type printing plate material and a kind of the defect and dimension data indicating a width and a length of the roll type printing plate material, and
   wherein the thickness of the wireless memory tag is 0.1 mm or less.

2. The printing plate material product of claim 1, wherein the image forming layer includes a thermosensitive image forming layer and a hydrophilic layer and is developable while the printing plate material is mounted on a printing apparatus.

3. The printing plate material product of claim 2, wherein the printing plate material is processed based on the product data stored in the wireless memory tag by the printing apparatus.

4. The printing plate material product of claim 1, wherein the product data include printing plate material data.

5. The printing plate material product of claim 4, wherein the printing plate material data include at least one of a kind, a lot number, a size, a produced-date, and a sensitivity of the printing plate material.

* * * * *